June 7, 1960

E. C. GIAIMO, JR 2,939,787

EXPOSURE OF PHOTOCHEMICAL COMPOSITIONS

Filed March 1, 1957

INVENTOR.
EDWARD C. GIAIMO, JR.
BY
E. C. Whittaker
ATTORNEY

United States Patent Office 2,939,787

Patented June 7, 1960

2,939,787

EXPOSURE OF PHOTOCHEMICAL COMPOSITIONS

Edward C. Giaimo, Jr., Princeton, N.J., assignor to Radio Corporation of America, a corporation of Delaware Filed Mar. 1, 1957, Ser. No. 643,293

11 Claims. (Cl. 96—1)

Figure 1:
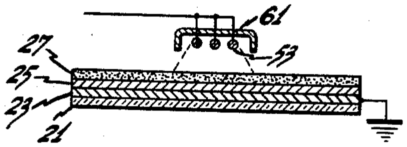

This invention relates to photochemical compositions and particularly, but not necessarily exclusively, to improved methods for exposing photochemical compositions, especially in photoetching processes. A photochemical composition is a material which is irreversibly altered as to its chemical or crystallographic constitution upon exposure to light of a particular type.

Photoresists, which comprise one class of photochemical compositions, are commonly used in the graphic arts for preparing typographic, lithographic and gravure printing plates. Photoresists are also commonly used in the electronic arts for preparing etched circuits and components. In conventional photoetching processes, the object to be etched, usually a metal plate or metal clad substrate, is coated with a water-soluble photoresist. The photoresist is then exposed to an ultraviolet light image, usually by contact exposure, until the exposed photoresist is insolubilized or "hardened" in the exposed areas. The unexposed photoresist is washed away and the object is etched to the desired depth.

Conventional photoresists generally require relatively long exposures to the ultraviolet light image because of the relative insensitivity of the photoresists available. Consequently, it becomes a practical necessity to first prepare a permanent, relatively dense, full size transparency of the subject matter to be etched. The transparency must then be held firmly against the photoresist during the relatively long, intense exposure to ultraviolet light to obtain the necessary hardening of the photoresist with a minimum loss in resolution. To accomplish this, photoetchers resort to special vacuum frames for holding the transparency in place, and to intense ultraviolet light sources for exposure. Even so, exposure times of 10 minutes or more are common.

By a second photoetching process, the object to be etched is coated with a photoconducting composition comprising a particulate photoconductor dispersed in an electrically-insulating, film-forming vehicle. The photoconductive coating is electrostatically charged and then exposed to an ordinary visible light image, thereby producing a latent electrostatic image on the coating. The latent electrostatic image is developed with a fusible powder and the powder fused to the coating. The photoconducting coating is then removed from areas not covered by the fused image and the object is etched in the usual way. This second photoetching process does not require the long intense exposures and the special transparency holding equipment of the conventional processes.

This second photoetching process has the further advantage that one may enlarge or reduce the size of the image to be etched with convenient exposures. However, by this second process, the resolution of the etched image leaves something to be desired. This second process is described by Meyer L. Sugarman, Jr., in "Electrofax—A New Tool for the Graphic Arts," The American Pressman, November 1955, and by H. G. Greig in "The Electrofax Photoresist Makes Exposure by Projection Printing a Possibility," The Photoengravers Bulletin, volume 46, No. 4 (November 1956), page 133 to 138.

An object of this invention is to provide improved processes for exposing photochemical compositions.

Another object is to provide high resolution photoetching processes which do not require permanent full size transparencies or special equipment for holding the transparencies in contact with the photoresist during exposure.

A further object is to provide processes for exposing a photochemical composition wherein one may enlarge or reduce the size of the image to be recorded on the composition.

Generally, the foregoing objects are accomplished by producing a temporary powder image of a predetermined configuration substantially in contact with a photochemical composition, for example, a photoresist, and then exposing the photochemical composition with the powder thereon to light within the spectral sensitivity of the photochemical composition and within the spectral range in which the powder image is opaque. Following the exposure, the powder image may be removed if desired and the photochemical composition treated in the usual way.

The powder image is preferably produced electrostatically. In one method of producing this image a thin layer of an electrically-insulating material is provided upon the photoresist. A latent electrostatic charge pattern of a desired configuration is produced on the layer, and then the latent electrostatic image is developed with an electrostatically-attractable powder to produce the temporary powder image.

A preferred method for producing the latent electrostatic image comprises coating the object with a thin layer of a photoconducting insulating material consisting essentially of a particulate photoconductor dispersed in an electrically-insulating, film-forming vehicle. The photoconducting coating is uniformly electrostatically-charged and then exposed to a visible light image, thereby producing a latent electrostatic image of a predetermined configuration with a relatively brief and convenient exposure.

The powder image, which is substantially in contact with the photochemical composition, is cheaply and easily produced, and does not require special means of hold down during the exposure of the photochemical composition. Thus, the invention eliminates the need for permanent full size transparencies and special holddown apparatus therefor. By virtue of the close spacing of the powder image, the resolution of the ultimate image is improved. A further advantage of the preferred processes herein is that one may enlarge or reduce the size of the transparency image with convenient exposure times due to the greater photosensitivity of the photoconducting coating.

Figure 5:
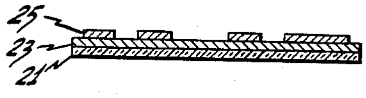
Figure 6:
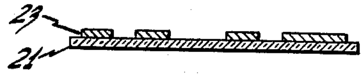
Figure 7:
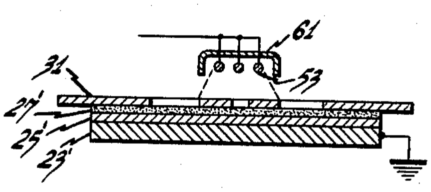

The foregoing objects and other advantages are described in greater detail by reference to the accompanying drawing in which:

Figures 1 to 6 are a series of sectional views illustrating the preparation of an etched circuit plate by the preferred process herein and, Figure 7 is a sectional view illustrating the photoengraving of a typographic printing plate by an alternate process herein.

Similar reference characters are applied to similar elements throughout the drawings.

ETCHED CIRCUITS

In the preparation of etched circuits or components for use in the electronics industry by the processes herein, a dielectric sheet is provided on at least one surface with a conducting layer, such as copper or silver foil, bonded to the dielectric. The conducting layer is coated with a photoresist layer and then coated with a thin layer of a photoconducting material comprising a powdered photoconductor suspended in an electrically-insulating, film-forming vehicle. An electrostatic image is produced upon the photoconducting coating, developed with an electroscopic powder, and then exposed to a light source to harden the photosensitive resist selectively. The developing powder is removed and reclaimed. The photoconducting layer is removed completely. Then, using conventional techniques, the photoresist layer is removed selectively to produce the acid or alkali resist image. The bare conducting layer is then removed selectively, for example, by etching.

*Example 1*

Referring to Figure 1, a layer of copper foil 23 about .001" thick is bonded by any convenient method to one surface of a pressed phenolic resin sheet 21. This copper clad phenolic resin sheet will hereinafter be referred to as the substrate. The surface of the copper foil 21 is coated with the following photoresist formulation:

| | G. |
|---|---|
| Photoengraving glue | 360 |
| Ammonium bichromate | 52.5 |
| Dried albumin | 7.5 |
| Water to make 1 liter. | |

The formulation is coated by any of the commonly used techniques, as by spin coating, and then dried to form a photoresist coating 25. A mixture is prepared of the following materials:

96 grams of silicone resin (G.E. SR–82) marketed by the General Electric Co., Silicone Products Division, Waterford, N.Y.
225 grams of toluene
240 grams of photoconducting zinc oxide such as Florence Green Seal–8 marketed by the New Jersey Zinc Co., Palmerton, Pa.

This liquid mixture is ball milled for about 3 hours and then applied to the surface of the photoresist layer 25 to produce a photoconducting coating 27 about 0.0005 inch thick. Any standard coating technique may be used, for example, spraying, dipping, spin coating, or brushing on.

While a phenolic resin sheet having a copper foil bonded thereon is preferred, any arrangement of layers of dielectric and conducting materials that are suitable for the ultimate product may be used. It is desirable that the photoresist layer 25 and the copper layer 23 immediately below the photoconducting coating 27 have relatively good electrical conductivity in order to aid in the electrostatic printing process. The conductivity of the layers 25 and 23 may range between that of a material such as paper and that of a relatively conducting material such as metal or carbon.

Referring to Figure 1, the surface of the layer 27 is given an over-all electrostatic charge as follows. The copper layer 23 is grounded and an electrostatic charging device 61 is passed in darkness over the photoconducting coating 27. The charging device may comprise an array of fine wires 53 mounted near the grounded copper layer 23. A source of D.C. high voltage (not shown) is connected between the wires 53 and ground to provide a negative potential of about 6000 volts on the wires with respect to the copper layer 23. The voltage should be sufficiently high to cause a corona discharge adjacent the wires. The apparatus and process may produce a blanket positive charge if the polarity of the wires 53 is positive with respect to the copper layer 23.

Figure 2:
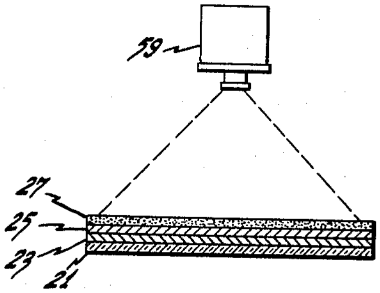

The next step is to discharge selected parts of the charged surface of the photoconducting coating 27 in order to produce an electrostatic image thereon. Referring to Figure 2 this may be accomplished by exposing the photoconducting coating 27 to a light image derived, for example, from a projector 59 containing a master of the component or circuit to be printed. A light image approximately 8" x 12" in area is projected on the charged surface of the photoconducting coating 27 for about 2 seconds with a 200 watt incandescent light source from a 35 mm. transparency at *f*5.6. The subject to be printed may, however, be any subject used in ordinary photographic processes. Any type of electromagnetic radiation may be used depending on the spectral sensitivity of the photoconducting coating 27. For example, visible light, infrared and ultraviolet rays may be used. The exposure to the light image is of such short duration as to leave the photorresist coating 25 substantially unaffected.

Wherever the light strikes the surface of the photoconducting coating 27, the electrostatic charge thereon is reduced or removed. This leaves an electrostatic image or pattern of charges corresponding to the dark portions of the light image. Other methods of producing an electrostatic image may also be used.

Figure 3:
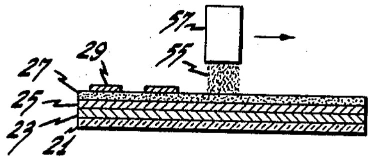

The electrostatic image may be stored for a time if desired. Ordinarily the next step is to develop the electrostatic image with a material which will subsequently prevent light from reaching the resist layer 25. Referring to Figure 3 development may be accomplished by maintaining the photoconducting coating 27 in darkness and passing a developer brush 55 containing a developer powder across the surface of photoconducting coating 27 bearing the electrostatic image. Areas of developer powder 29 are deposited on those areas of the surface retaining an electrostatic charge. The developer brush preferably comprises a mixture of magnetic carrier particles, for example, powdered iron and the developer powder. The mixture is secured in a magnetic field by a magnet 57 to form a developer brush.

A preferred carrier material for the developer mix consists of "alcoholized iron," that is, iron particles free from grease and other impurities soluble in alcohol. These iron particles are preferably relatively small in size, being in their largest dimension about .002 to .008". Satisfactory results are also obtained using a carrier consisting of iron particles of a somewhat wider range of sizes up to about .001 to .020".

A preferred developer powder may be prepared as follows. A mixture comprising 200 grams of 200 mesh Piccolastic resin 4358 (an elastic thermoplastic resin composed of polymers of styrene, substituted styrene and its homologs) marketed by the Pennsylvania Industrial Co., Clairton, Pa.; 12 grams of Carbon Black 6, marketed by the Eimer and Amend Co., New York, N.Y.; 12 grams of spirit Nigrosine SSB, marketed by the Allied Chemical and Dye Co., New York, N.Y., and 8 grams of Iosol Black, marketed by the Allied Chemical and Dye Co., New York, N.Y., are thoroughly mixed in a stainless steel beaker at about 200° C. The mixing and heating should be done in as short a time as possible. The melt is poured onto a brass tray and allowed to cool and harden. The hardened mix is then broken up and ball milled for about 20 hours. The melted powder is screened through a 200 mesh screen and is then ready for use as a developer powder. This powder takes on a positive electrostatic charge when mixed with glass beads or iron powder. It therefore develops an electrostatic image composed of negative charges. 2–4 grams of the developer powder and 100 grams of the magnetic carrier material are blended together giving the completed developer mix. Other ratios may be used.

The developer image 29 may, but preferably is not, fixed to the photoconducting coating 27. The powder image should be fixed in cases where it is desired to transparentize the photo conducting coating 27. In this case the powder image is fixed and the photoconducting coating treated with a solvent for the photoconductor. The solvent penetrates the porous photoconducting coating dissolving the photoconductor and leaving the film-forming vehicle and the image undisturbed. If the developer powder or vehicle in the photoconducting coating 27 has a relatively low melting point, the image may be fixed by heating, for example, with an infrared lamp to fuse the powder to the surface. Sulphur or synthetic resin powders may be fixed in this way. Alternatively, the powder image 29 may be pressed into the photoconducting coating 27. Another method of fixing the powder image 29 is to apply a light coating of a solvent for the material of the powder image 29. The solvent softens the developer powder particles and causes them to adhere to one another and to the photoconducting coating 27. Alternatively, a solvent may be used to soften the photoconducting coating 27 and cause the developer powder particles to adhere thereto. Upon standing and preferably with the application of a slight amount of heat the solvent is evaporated from the printing base. The powder pattern thus formed is in very close contact with the photoresist, which is conducive to good resolution. The powder pattern takes the place of a contact negative or other pattern previously used in this type of process.

Figure 4:
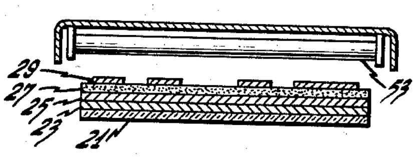

Referring to Figure 4, the entire assembly with the unfixed powder image 29 thereon is exposed to light from a 1000 watt mercury vapor lamp 53 spaced about 12 inches for about 10 minutes. The photoresist exposed to the light is hardened, or insolubilized.

The unfixed powder image 29 is now removed. In a preferred embodiment, a magnetic brush comprising only magnetic particles held by a magnetic field is swept across the surface of the photoconducting layer 29. The particles of the unfixed image adhere to magnetic particles and are thereby completely removed. If the powder image has been fixed, it may be left in place. However, by the preferred embodiment the developer powder is recovered and may be reused.

The coated substrate is now washed with toluene to remove the photoconducting layer 27. Then, the substrate is immersed in warm water at about 120° C. to remove the unhardened photoresist. The washed substrate is then preferably baked at about 300° C. until the remaining photoresist turns a light brown. Referring to Figure 5, the copper foil 23 of the substrate is bare except where there is a photoresist image 25 thereon.

Referring now to Figure 6, the bare portions of the copper layer 23 are now etched. This may be accomplished with a standard metal etching bath. In the case of copper, a 40° Baumé ferric chloride solution will remove copper quickly and easily. Alkali solutions may be used for aluminum layers and acid baths may be used for silver. After etching, the substrate is rinsed and dried. The photoresist 25 covering those portions of metal remaining in the substrate is then removed.

PHOTOCONDUCTING INSULATING COATINGS

The coating 27 of Example 1 may be designed to have a desired spectral response, speed of response, and contrast characteristics for producing the powder image. By a proper choice of the photoconductor and the vehicle, almost any spectral response, speed of response or contrast characteristic may be obtained. An essential characteristic of the photoconducting coating 27 is that it should be transparent or translucent to the wavelengths which are necessary to affect the photoresist coating 25 beneath. An essential characteristic of the film-forming vehicle is that it has a solvent that will not affect the photoresist coating 25.

Any photoconducting layer usable in electrophotography may be used in the invention. Preferably, the photoconducting material comprises a particulate photoconductor dispersed in an electrically-insulating, film-forming vehicle. Some of the useful photoconducting layers are described by C. J. Young and H. G. Greig in "Electrofax-Direct Electrophotography Printing on Paper," RCA Review, December 1954, volume 15, No. 4, pages 469 to 484; by E. Wainer, "Phosphor Type Photoconducting Coatings for Continuous Tone Electrostatic Electrophotography," Photographic Engineering, volume 3, No. 1, 1952, pages 12 to 22; and by A. Middleton in U.S. Patent No. 2,663,636, issued December 23, 1953.

Some suitable photoconducting coatings are photoconducting zinc oxide (Florence White Seal marketed by the New Jersey Zinc Co., Palmerton, Pa.) dispersed in a silicone resin, photoconducting zinc selenide (Mallinkrodt No. 8856 marketed by the Mallinkrodt Chemical Works, New York, N.Y.) dispersed in a silicone resin, photoconducting zinc sulfide (Cryptone ZS 800 marketed by the New Jersey Zinc Co., Palmerton, Pa.), and panchromatically-sensitive zinc oxide prepared according to either U.S. Patent No. 2,727,807 or 2,727,808 to S. M. Thomsen dispersed in a silicone resin. In place of a silicone resin one may substitute a polystyrene resin, a polyvinyl acetate resin, a polyvinyl-chloride acetate resin, carnauba wax or other electrically-insulating, film-forming vehicle. A preferred composition may be prepared by intimately mixing 100 grams of a photoconducting zinc oxide, such as Florence Green Seal No. 8 marketed by the New Jersey Zinc Company, Palmerton, Pa., with 65 grams of a 60% solution of a silicone resin in xylene (such as GE SR-82 marketed by the General Electric Co., Silicone Products Division, Waterford, N.Y.) and 85 grams of toluene.

NON-PHOTOCONDUCTING INSULATING COATINGS

A coating which is electrically-insulating but not photoconducting may also be used. However, in order to be used, the electrostatic image must be formed by some method other than optically. A method which scans the electrically-insulating surface with a beam of electrons is described in U.S. Patent 2,143,214 to Paul Selenyi. A method which uses a photoemissive material is described in U.S. Patent 2,221,776 to Chester F. Carlson.

*Example 2*

A method which uses the corona discharge of Example 1 and a non-photoconducting, insulating coating to produce a typographic printing plate is depicted in Figure 7. A copper sheet 23' is coated with a photoresist 25' as in Example 1. An electrically-insulating layer 27', such as silicone resin, is placed over the photoresist coating 25'. The electrically-insulating layer 27' may be the same vehicle composition as the previously described photoconducting layer 27. A template 31 is placed over the insulating layer 27'. The template may be electrically-conducting or insulating. Areas are cut out where electrostatic charge is desired on the electrically-insulating layer 27'. The assembly is then exposed to a corona discharge from wires 53 as in Example 1. Electrostatic charge deposits upon the areas not covered by the solid parts of the template 31, forming an electrostatic image. The template 31 is removed and the electrostatic image is developed as in Example 1. All subsequent steps are the same as in Example 1 except that the copper plate is etched to a desired depth.

DEVELOPER POWDERS

The developer powder may be chosen from a large class of electrostatically-attractable materials. It may be either fusible on non-fusible, because it is preferred not to fix the developed image. The developer powder should be opaque to light to which the photoresist layer is sensitive. The developer powder is preferably electrically-charged to aid in the development of the electrostatic latent image. The powder may be electrically-charged because the powder (1) is electroscopic, or (2) has interacted with other particles with which it is triboelectrically active or (3) has been charged from an electric source such as a corona discharge. Examples of suitable developer powders are powdered zinc, powdered copper, carbon, sulphur, natural and synthetic resins or mixtures thereof.

The developer powder may be applied to the electrostatic image as in Example 1 or in other ways. For example, it may be dusted on the electrostatic image, or it may be mixed with glass beads or other suitable carrier particles and the mixture cascaded across the surface to be developed. The beads serve merely as a temporary carrier, releasing the powder particles upon contact with the charged surface.

The preferred powder described in Example 1 is a positively charged powder and will adhere readily to negatively charged areas of the electrostatic image. In the developed image described, the developed areas of the image correspond to the non-illuminated portions of the optical image. If the printing base is charged positively, as may be done in the case of lead iodide-resin coatings, and the same steps are carried through as above described, a reverse image is obtained. If a negatively-charged powder is used in place of the positively-charged powder, then a reverse image is obtained in the first case and a positive-image is obtained in the alternative case.

PRINTING PLATES

Printing plates for typographic, lithographic, gravure and silk screen printing may be prepared by the methods of the invention. The same procedure may be followed as described under Etched Circuits and elsewhere in this specification with the following modifications. For typographic and gravure printing plates, solid plate of metal is preferred in place of the metal-clad insulating sheet; and the plate is etched to a desired depth instead of etching all the way through. For lithographic printing plates, a metal plate having a hydrophilic surface, such as grained aluminum or magnesium, is used in place of the metal-clad insulating sheet; and the plate is etched to convert the hydrophilic areas to hydrophobic. For screen printing plates, a screen is used in place of the metal-clad insulating sheet; and the etching is omitted. Any screen material may be used in the process of the invention. However, where electrically-insulating materials are used, the coating should rest upon a conducting plate during the step of producing a blanket electrostatic charge upon the surface of the photoconducting coating 27. Thus, materials such as silk and nylon may be used as well as metallic screens.

PHOTORESISTS

The photochemical composition may be a photoresist. Any of the conventional photoresists may be used. Some examples of suitable photoresists are found in H. Bennett, The Chemical Formulary, D. Van Nostrand Company, Inc., New York, N.Y., vol. II, 1935, pages 402–404, and vol. VI, 1943, page 385.

PHOTOSENSITIVE GLASS

The photochemical composition may also be a photosensitive glass, particularly the type which is subsequently chemically etched. One type of selectively etchable photosensitive glass is described in S. D. Stookey, "Chemical Machining of Photosensitive Glass," Industrial and Engineering Chemistry, volume 45, January 1953, pages 115 to 118. A sheet of this glass may be exposed for example, by coating the sheet with a photoconducting insulating coating and then proceeding as in Example 1. The photosensitive glass may be considered the photoresist and the object to be etched. Thus, the procedure is the same as in Example 1 except that the photosensitive glass is substituted for the bottom three layers 21, 23 and 25 of Example 1. A glass etching solution is substituted for the metal etching solution of Example 1.

OTHER PHOTOCHEMICAL COMPOSITIONS

Any photochemical composition used in photographic processes may be used in the processes herein. For example, silver halide emulsions, diazo compositions, dyes which bleach upon exposure, photosensitive vinyl chloride, and bichromate polyvinyl alcohol may be used.

There have been described improved processes for exposing photoresists. The processes herein do not require permanent full size transparencies or special equipment for holding the transparency against the photoresist during exposure. The processes herein further permit enlargement or reduction of the size of the image with convenient exposures.

What is claimed:

1. A process utilizing a photographic element comprising a substrate of a photochemical photographically sensitive material having adhering to one surface thereof a photoconductive insulating coating of a particulate photoconductor dispersed in an electrically insulating film-formed vehicle, said coating being substantially translucent to radiations of a wavelength to which said photochemical material is sensitive; said process comprising the steps of:

(1) electrophotographically forming an electrostatic image on said photoconducting insulating coating;

(2) developing said electrostatic image with developer particles opaque to radiations of said wavelength; and, (3) exposing said substrate to radiations of said wavelength through said photoconductive insulating layer to produce in said substrate a photochemical image.

2. The process of claim 1 including the additional step of developing said photochemical image in said substrate to produce therein a permanent image.

3. The process of claim 1 wherein said electrostatic image is produced by applying a substantially uniform electrostatic charge to said coating and then exposing said coating to a light image.

4. The process of claim 1 wherein said substrate comprises photosensitive glass and said process includes the additional steps of:

(4) removing said developer particles and said photoconducting insulating coating from said photosensitive glass; and, (5) etching said photosensitive glass.

5. A process utilizing a photgraphic element comprising a substrate, a layer of photochemical photographically hardenable material adhering to one surface of said substrate, and a photoconductive insulating coating of a particulate photoconductor dispersed in an electrically-insulating film-formed vehicle, said coating being substantially translucent to radiations of a wavelength to which said layer is sensitive, said process comprising the steps of:

(1) electrophotographically forming an electrostatic image on said coating;

(2) developing said electrostatic image with developer particles opaque to radiations of said wavelength to produce a powder image on said coating;

(3) exposing said layer to radiations of said wavelength through said photoconductive insulating coating to harden said layer in areas not covered by said powder image;

(4) removing said powder image;

(5) removing said photoconductive insulating coating; and, (6) selectively removing unhardened material from said layer to uncover areas of said substrate formerly masked by said powder image.

6. The process of claim 5 wherein at least said one surface of said substrate comprises material soluble in an etchant and said process includes the additional step of etching said one surface in areas not covered by said hardened layer.

7. An article of manufacture comprising a support layer, a second layer of photochemical, photographically sensitive material adhering to one surface of said support layer and an adherent photoconducting, insulating coating on said second layer, said coating comprising a particulate photoconductor dispersed in an electrically-insulating film-formed vehicle, said coating being substantially translucent to radiations of a wavelength to which said material is sensitive.

8. An article of manufacture comprising an etchable support layer, a second layer of light-hardenable, photographically-sensitive resist adhering to one surface of said support layer, and an adherent photoconductive insulating coating on said second layer, said coating comprising a particulate photoconductor dispersed in an electrically-insulating film-formed vehicle, said coating being substantially translucent to radiations of a wavelength to which said resist is sensitive.

9. An article of manufacture comprising a support layer of photosensitive glass and an adherent photoconductive insulating coating on one surface of said support layer, and coating comprising a particulate photoconductor dispersed in an electrically-insulating film-formed vehicle, said coating being substantially translucent to radiations of a wavelength to which said glass is sensitive.

10. The article of manufacture of claim 8 wherein said support layer comprises an etchable metal.

11. The article of manufacture of claim 8 wherein said support layer comprises a dielectric sheet having bonded on one surface thereof a conducting etchable metallic layer.

References Cited in the file of this patent

UNITED STATES PATENTS

| | | |
|---|---|---|
| 980,290 | Kubel et al. | Jan. 3, 1911 |
| 1,285,015 | Browning | Nov. 19, 1918 |
| 1,303,635 | Capstaff | May 13, 1919 |
| 1,564,753 | Capstaff | Dec. 8, 1925 |
| 1,912,693 | Cornell | June 6, 1933 |
| 2,173,741 | Wise et al. | Sept. 19, 1939 |
| 2,257,143 | Wood | Sept. 30, 1941 |
| 2,297,691 | Carlson | Oct. 6, 1942 |
| 2,681,473 | Carlson | June 22, 1954 |
| 2,693,416 | Butterfield | Nov. 2, 1954 |
| 2,725,296 | Kendall | Nov. 29, 1955 |
| 2,844,543 | Fotland | July 22, 1958 |
| 2,857,271 | Sugarman | Oct. 21, 1959 |

FOREIGN PATENTS

| | | |
|---|---|---|
| 203,907 | Australia | Nov. 1, 1956 |